United States Patent
Ho

(10) Patent No.: US 7,464,350 B1
(45) Date of Patent: Dec. 9, 2008

(54) METHOD OF AND CIRCUIT FOR VERIFYING A LAYOUT OF AN INTEGRATED CIRCUIT DEVICE

(75) Inventor: Min-Fang Ho, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 143 days.

(21) Appl. No.: 11/502,919

(22) Filed: Aug. 11, 2006

(51) Int. Cl.
  *G06F 17/50* (2006.01)
(52) U.S. Cl. .............. 716/4; 716/1; 716/3; 716/5; 716/18; 703/13; 703/14
(58) Field of Classification Search .......... 716/1–6, 716/18; 703/13, 14
See application file for complete search history.

(56) References Cited

U.S. PATENT DOCUMENTS

| | | | | |
|---|---|---|---|---|
| 5,062,054 A | * | 10/1991 | Kawakami et al. ............ | 716/5 |
| 5,901,066 A | * | 5/1999 | Hong ............................ | 716/8 |
| 7,096,441 B2 | * | 8/2006 | Lo et al. ........................ | 716/5 |
| 7,124,382 B1 | * | 10/2006 | Eccles et al. ................... | 716/5 |
| 2005/0223347 A1 | * | 10/2005 | Okuaki ........................ | 716/5 |

* cited by examiner

*Primary Examiner*—Jack Chiang
*Assistant Examiner*—Nghia M Doan
(74) *Attorney, Agent, or Firm*—John J. King

(57) ABSTRACT

A method of verifying a layout of an integrated circuit device is disclosed. The method comprises steps of receiving a physical layout for a schematic of a circuit implemented in the integrated circuit device; generating an implant table file having data showing a relationship between layers and device types of the integrated circuit device; and generating a layout-versus-schematic rules file using the implant table file.

20 Claims, 4 Drawing Sheets

METHOD OF AND CIRCUIT FOR VERIFYING A LAYOUT OF AN INTEGRATED CIRCUIT DEVICE

FIELD OF THE INVENTION

The present invention relates generally to integrated circuit devices, and in particular, to a method of and a circuit for verifying a layout of an integrated circuit.

BACKGROUND OF THE INVENTION

In the field of semiconductor integrated circuit design, it is important that a layout of an integrated circuit be thoroughly checked before committing to the fabrication of the integrated circuit. Design errors that escape early detection result in significant problems for manufacturers of integrated circuits, including loss in time to market and costly retooling. Errors may be produced during the design stage, document editing stage, or substrate fabrication stage. Because the stages of producing an integrated circuit device involve many distinct groups responsible for generating different data necessary to produce the integrated circuit, verifying the data generated by the various groups is a tedious and time consuming task. More importantly, efforts using conventional methods to verify a design may not result in the identification of all of the errors.

In producing an integrated circuit, various implant layers are created in a substrate to form elements of the devices implementing a circuit. Mask layers are required to form the various implant layers as well as metal layers necessary to form the integrated circuit device. Similarly, tagging layers are used to track blocks, often called intellectual property (IP) blocks, within a design. In a programmable logic device, for example, circuit elements formed in a substrate may be connected by a plurality of metal layers and vias. The various layers may be formed by a different group of engineers using different tools and having different requirements and criteria for creating the data related to their layers or processes. Accordingly, verifying the layout of an integrated circuit is a difficult task.

One area requiring verification in the production of an integrated circuit is the verification of layout-versus-schematic (LVS). After a schematic is generated for a given circuit, a layout of the various layers of an integrated circuit is created. The layout-versus-schematic verification process confirms that the physical layout of the integrated circuit implements the circuit design of the schematic. Conventional processes for providing LVS verification generate a layout file by extraction, and compare the extracted file for the layout to the schematic. For example, an extraction tool may create a netlist based upon the layout, and compare the created netlist to a netlist for the schematic.

However, for each generation of a product, a new LVS physical verification file needs to be defined for the particular process node. In the new process node, additional elements are defined, layer generation algorithms change, and processing steps change. Because of the changes involved with each new technology node, additions, modifications, and deletions must be made to the LVS flow manually by the integrated circuit computer aided design (IC CAD) engineers responsible for the physical flow. This manual process may be time consuming because of the time required to coordinate between the technology development (TD) team, the IC CAD team, and the IC design (ICDES) team. Furthermore, the process is error-prone because conventional LVS rule files use implant layers only to identify particular devices, but do not exclude unwanted implant layers.

Currently, the LVS modification flow involves an IC CAD engineer performing the manual modification necessary to support the new process node. However, a successful modification process is highly dependent on the skill and experience of the IC CAD engineer and the engineer's understanding of the process technology. It is then followed by a peer LVS review within the IC CAD team for locating potential pitfalls visually. Finally, a LVS review is performed again with the ICDES team and the TD group for final approval. However, this process presents a lot of challenges since many TD engineers and ICDES engineers may not understand the underlaying LVS syntax and software engine. The verification process is further complicated by the need for multiple LVS rules files to be written for multiple tools and multiple foundries.

Accordingly, there is a need for an improved method of circuit for verifying a layout of an integrated circuit.

SUMMARY OF THE INVENTION

A method of verifying a layout of an integrated circuit device is disclosed. The method comprises steps of receiving a physical layout for a schematic of a circuit implemented in the integrated circuit device; generating an implant table file having data showing a relationship between layers and device types of the circuit to be implemented in the integrated circuit device; generating a layout-versus-schematic rules file using the implant table file; and performing a layout-versus-schematic verification of the physical layout using the layout-versus-schematic rules file. The step of generating a layout-versus-schematic rules file using the implant table file may comprise a step of generating a plurality of layout-versus-schematic rules files associated with a plurality of layout-versus-schematic verification tools. The method may further comprise a step of performing a design rules check of the physical layout of the integrated circuit.

According to an alternate embodiment, a method of verifying a layout of an integrated circuit device comprises steps of receiving a physical layout for a schematic of a circuit to be implemented in the integrated circuit device comprising a plurality of layers and a plurality of devices; providing an implant table comprising an entry for each layer of the physical layout and each device type of the plurality of devices; providing an indication in the implant table of a positive relationship between a layer and a device type of the plurality of layers and a plurality of devices; providing an indication in the implant table of a negative relationship between another layer and another device type of the plurality of layers and a plurality of devices; and generating a layout-versus-schematic rules file using the implant table.

According to another alternate embodiment, a method of verifying a layout of an integrated circuit device comprises the steps of receiving a schematic of a circuit to be implemented in the integrated circuit device; receiving a physical layout for the schematic; performing a design rule check for the physical layout; generating an implant table file having data showing a relationship between each layer of the physical layout and each device type of the circuit to be implemented in the integrated circuit device; generating a layout-versus-schematic rules file using the implant table file; and performing a layout-versus-schematic verification of the physical layout and the schematic of the integrated circuit using the layout-versus-schematic rules file. The method may further comprise a step of determining, in response to the step of performing a layout-versus-schematic verification, if the physical layout has an error or if an error in the process specification is detected.

DETAILED DESCRIPTION OF THE DRAWINGS

Figure 1:
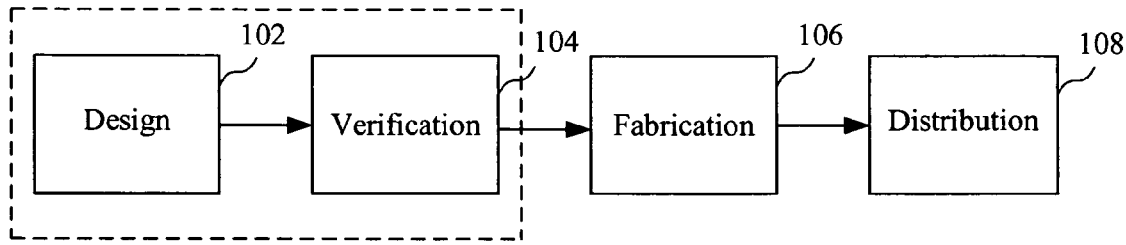
FIG. 1 is a block diagram of a process for generating an integrated circuit device according to an embodiment the present invention.

Turning first to FIG. 1, a block diagram of a process for generating an integrated circuit device according to an embodiment the present invention is shown. In particular, a design 102 is generated for a circuit to be implemented in an integrated circuit. The design is then subjected to a verification process 104. The verification process may comprise a number of steps for ensuring that the layout of the circuit is correct. For example, the verification may comprise the verification of the layout-versus-schematic, as described above. While the design and verification processes are performed by different groups of engineers, the verification process according to the embodiments of the present invention, as will be discussed in more detail below, improve both efficiency and accuracy of the overall verification process. After the device has been verified, the fabrication process 106 enables the production of the integrated circuits, which are eventually distributed during a distribution stage 108.

Figure 2:
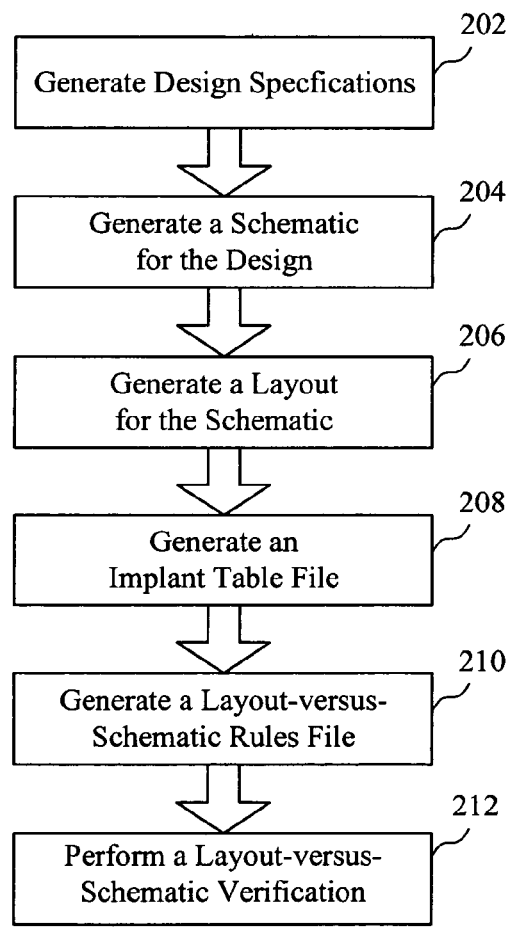
FIG. 2 is a flow diagram showing the operation of designing and verifying the layout of an integrated circuit device according to an embodiment of the present invention.

Turning now to FIG. 2, a flow diagram shows the operation of designing and verifying the layout of an integrated circuit device according to an embodiment of the present invention. In particular, a design specification is generated at a step 202. A schematic is generated for the circuit design at a step 204. A layout for the schematic is then generated at a step 206. The layout defines the various physical layers of the integrated circuit which are required to be formed to achieve the circuit design. An implant table file is generated at a step 208. As will be described in more detail in reference to FIG. 5, the implant table file defines the various relationships between layers of the integrated circuit associated with a certain process and device types which may be used to implement the circuit design. The implant table file is specific to a process (e.g., a process for implementing transistors having 90 nm gates) and the device types which may be implemented according to the processes. While one process may be implemented according to 90 nm technology, a different process implementing 90 nm transistors using different layers or different devices may also be defined, and would have a different implant table file. A LVS rules file is generated at a step 210 based upon the implant table file. Finally, the LVS rules file is used to perform a LVS verification at a step 212. The operation of generating the LVS rules file will be described in more detail in reference to FIG. 4.

Figure 3:
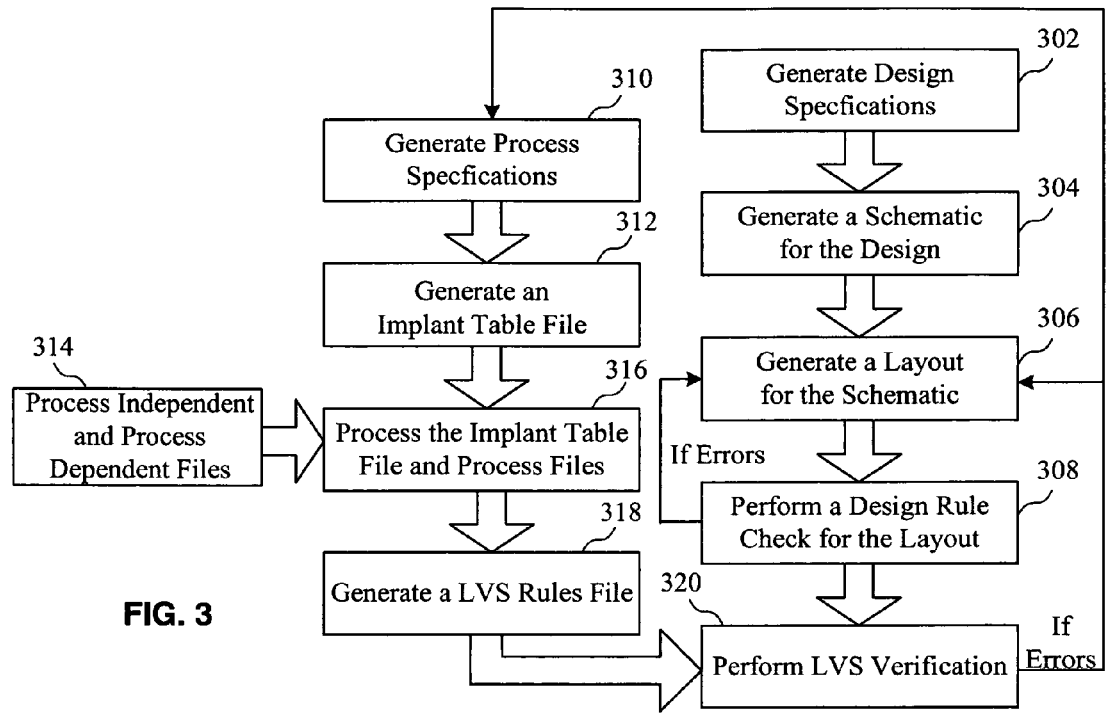
FIG. 3 is a flow diagram showing the operation of designing and verifying the layout of an integrated circuit device according to an alternate embodiment of the present invention.

Turning now to FIG. 3, a flow diagram shows the operation of designing and verifying the layout of an integrated circuit device according to an alternate embodiment of the present invention. In particular, a design specification is generated at a step 302. A schematic is generated for the circuit design at a step 304. A layout for the schematic is then generated at a step 306. A design rules check may then be performed for the layout at a step 308. Design rules are a series of parameters provided by semiconductor manufacturers to enable circuit designers to verify the correctness of a schematic and or mask set. Design rules are generally specific to a particular semiconductor manufacturing process. A set of design rule specifies certain geometric and connectivity restrictions to ensure sufficient margins which account for variability in semiconductor manufacturing. A design rules check is performed to improve reliability and achieve a high yield. If errors requiring correction are detected during the design rules check, a new layout for the schematic may be generated.

Concurrently, process specifications are generated at a step 310. The process specification may define, for example, the various types of layers, the thicknesses of layer, dimensions of components (e.g., 90 nm gates for transistors). An implant table file, as described above, is also generated at a step 312. Process independent and process dependent files are generated at a step 314. Process independent files define aspects of the process specification which are independent of the fabrication process, while process dependent files define aspects of the process specification which are specific to the process. The implant table files and process independent and process dependent files are processed at a step 316 to generate an LVS rules file at a step 318. The generation of the LVS rules file may be performed by an LVSGEN program, as will be described in more detail below in reference to FIGS. 4-6. Assuming that the results of the design rules check are satisfactory, a LVS verification is performed at a step 320. If errors are detected in the LVS verification, a new layout for the schematic or a new design process specification may be generated.

Figure 4:
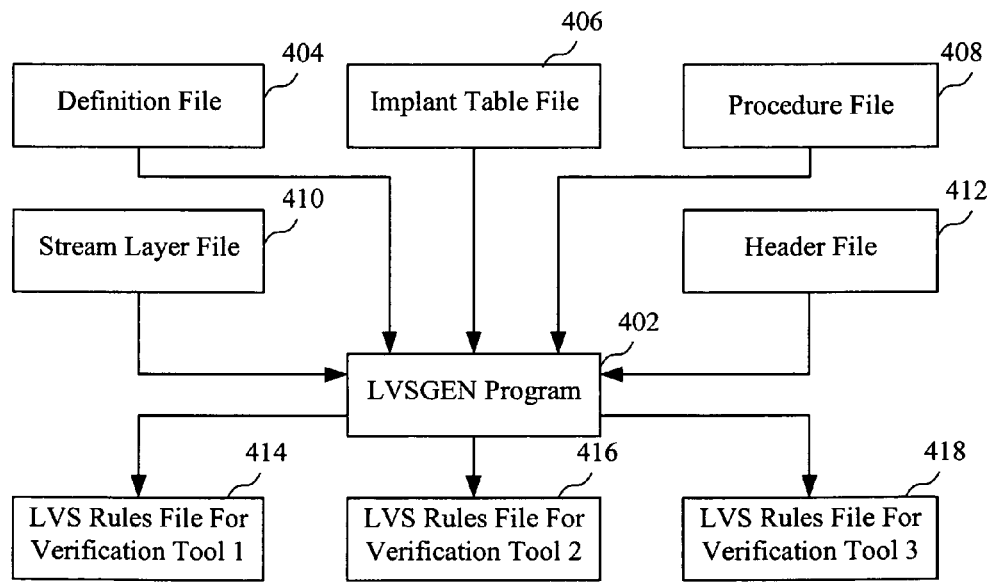
FIG. 4 is a block diagram showing the generation of layout-versus-schematic rules files according to an embodiment of the present invention.

Turning now to FIG. 4, a block diagram shows the generation of layout-versus-schematic rules files according to an embodiment of the present invention is shown. In particular, a layout-versus-schematic generation (LVSGEN) program 402 is coupled to receive a plurality of files related to the layout of the integrated circuit, including history files, process independent files and process dependent files in order to generate a LVS rules file. History files generally include information such as basic headers or other comments related to the layout or revised layout. A process independent file generally defines macros for generating elements of the circuit and is independent of the process used to generate the integrated circuit. Finally, a process dependent file provides specific information related to the specific processing steps in fabricating the integrated circuit.

According to one embodiment, a definitions file 404 comprises process independent basic layer definitions incorporated in the implant table file. The definitions file may contain basic definitions for layers such as n diffusion (ndif), p diffusion (pdif), p+ source drain area (psd), n+ source drain area (nsd), p+ substrate connection tap (ptap), n+n-well connection tap (ntap), and the maximum number of metal layers and vias present in the process. The basic definitions file also provides a mechanism to insert customized switches requested by a designer. An implant table file 406 generally describes the definition and creation of implant layers of the physical devices used in the process node, and defines a relationship between layers and device types implemented according to a given process. The implant table file may comprise a comma separated value (CSV) file. Every implant layer on a CAD summary preferably has an entry in the Implant Table file. The implant table file also preferably contains CAD layers used for special tagging purposes. For each device type implemented according to the process, a designation of a relationship such as "AND," "NOT," "TOUCH" or "NOT TOUCH" between the device type and the layer is defined, or specified as N/A as having no effect. That is, if there is overlapping of the implant layer and a device type, the entry in the table corresponding to the implant layer and the device type would be designated as "AND." If the implant layer and a device type do not overlap, the entry in the table corresponding to the implant layer and the device type would be designated as "NOT." If the implant layer and the device type are adjacent so that the layers touch one another but do not overlap, the entry in the table would be designated as "TOUCH." Conversely, if the implant layer and the device type are not adjacent, the entry in the table would be "NOT TOUCH." Finally, if a layer and a device type have no relationship, the entry is designated as "N/A." The relationship between the layers used in the process and the device types which may be implemented are process dependent, and may vary between processes. For example, while "AND," "NOT," "TOUCH," and "NOT TOUCH" may be used for one process, additional or other designations of relationships may be used for another process. For example, a different process may define a device type as "INSIDE" or "OUTSIDE" of a given layer. A designation of a relationship may comprise a positive relationship in which the designation indicates how the device type and the layer correspond to one another. For example, a positive relationship may indicate that the device type is completely covered by the layer, the device type and the layer overlap, or that the device type and the layer touch without overlapping. Similarly, a designation of a relationship may comprise a negative relationship. For example, a negative relationship may indicate that a device type and a layer do not overlap or do not touch.

A procedure file 408 is also coupled to the LVSGEN program 402. The procedure file comprises process independent, generic device recognition procedures, and is a set of procedures for extraction purposes only that have been fully tested in past generation. These procedures may be re-used from a previous process and require no modification. Finally, a stream layer file (SLF) 410 represents the stream layer for a final tapeout of the integrated circuit. That is, the actual layers used to generate a standard circuit layout format, such as a Mask Graphic Data System II (GDSII) database or other suitable database, are listed in the Stream Layer file, which is used for all Mask Stream In/Out operations. By using this file as an input to the LVS Rules file generation, the synchronization between the CAD summary, the SLF file, and the LVS rules file is further guaranteed. According to another aspect of the block diagram of FIG. 4, the LVSGEN program 402 generates a LVS rules file for each of a plurality of LVS verification tools, such as the Assura verification tool available from Cadence Design Systems of San Jose, Calif., the Calibre verification tool available from Mentor Graphics Corporation of Wilsonville, Oreg., or the Hercules verification tool available from Synopsys, Inc. of Mountain View, Calif., for example. The LVS generation program may be implemented by a processor of a general purpose computer, for example, or some other processing circuit of a computing device, and will be described in more detail in reference to FIG. 6.

The block diagram of FIG. 4 provides an automated process for the creation and maintenance of LVS rules files. Based on a detailed spreadsheet providing information related to the various layers and device types, an error free LVS rules file is provided for a physical verification tool. Accordingly, a variety of specification files created by different groups involved in the design of the integrated circuit are used to automatically generate LVS rules files for multiple physical verification tools. Because the implant table file is not tied to the physical verification tool syntax, the implant table file provides a clear overview of the implant layers used for each of the process devices. The implant table file greatly simplifies the review process and subsequent corrections necessary for the modification of LVS rules file. The resulting LVS rules file also provides an exhaustive definition of the device types to ensure that no unwanted implants are placed on top of the defined device types. That is, in addition to ensuring that a layer is located where it is supposed to be located, the LVS rules file generated based upon the implant table file also ensures that a layer is not located where it is not supposed to be located.

Figures 5, 7:
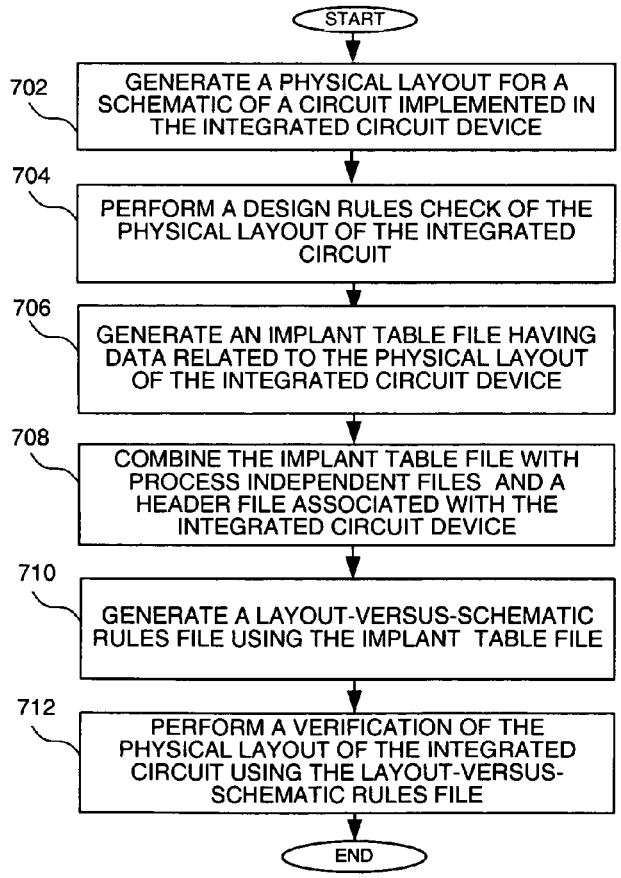
FIG. 5 is a table used for generating a layout-versus-schematic rules files according to an embodiment of the present invention.
FIG. 7 is a flow chart showing a method of verifying a layout of an integrated circuit device according to an embodiment the present invention.

Turning now to FIG. 5, a table used for generating a layout-versus-schematic rules file according to an embodiment of the present invention is shown. In particular, the rows of the implant table define the mask layers, the implant layers and the tagging layers. The columns of the table define the various device types formed in the substrate, such as different types of transistors, resistors and diodes. The various device types represent devices which may be implemented according to the process represented by the implant table file. For example, different transistors having different oxide thicknesses or having a certain channel type (e.g., N type or P type) may be identified as a device type in a column. Accordingly, for each device type identified in a column, a designation is provided with a corresponding layer used in a given process. A shown by way of example in the table of FIG. 5, a designation such as AND, NOT or N/A is provided for each corresponding device type and layer. If a given process is changed, the implant table may be changed accordingly, enabling the generation of a new LVS rules file. The use of the Implant Table file provides the various groups of engineers with a simple table of relationships, and contains enough information to describe and re-produce the layer generation algorithms specified by a CAD summary. The implant table also allows using positive and negative checking for identifying physical devices to make sure that all implant layers are only generated on the appropriate devices. All incorrectly placed implant layers over the recognized devices will cause the LVS verification process to fail. In some embodiments of the present invention, a comma separated file, or other format file, may be populated appropriately to capture the information in the implant table.

Figure 6:
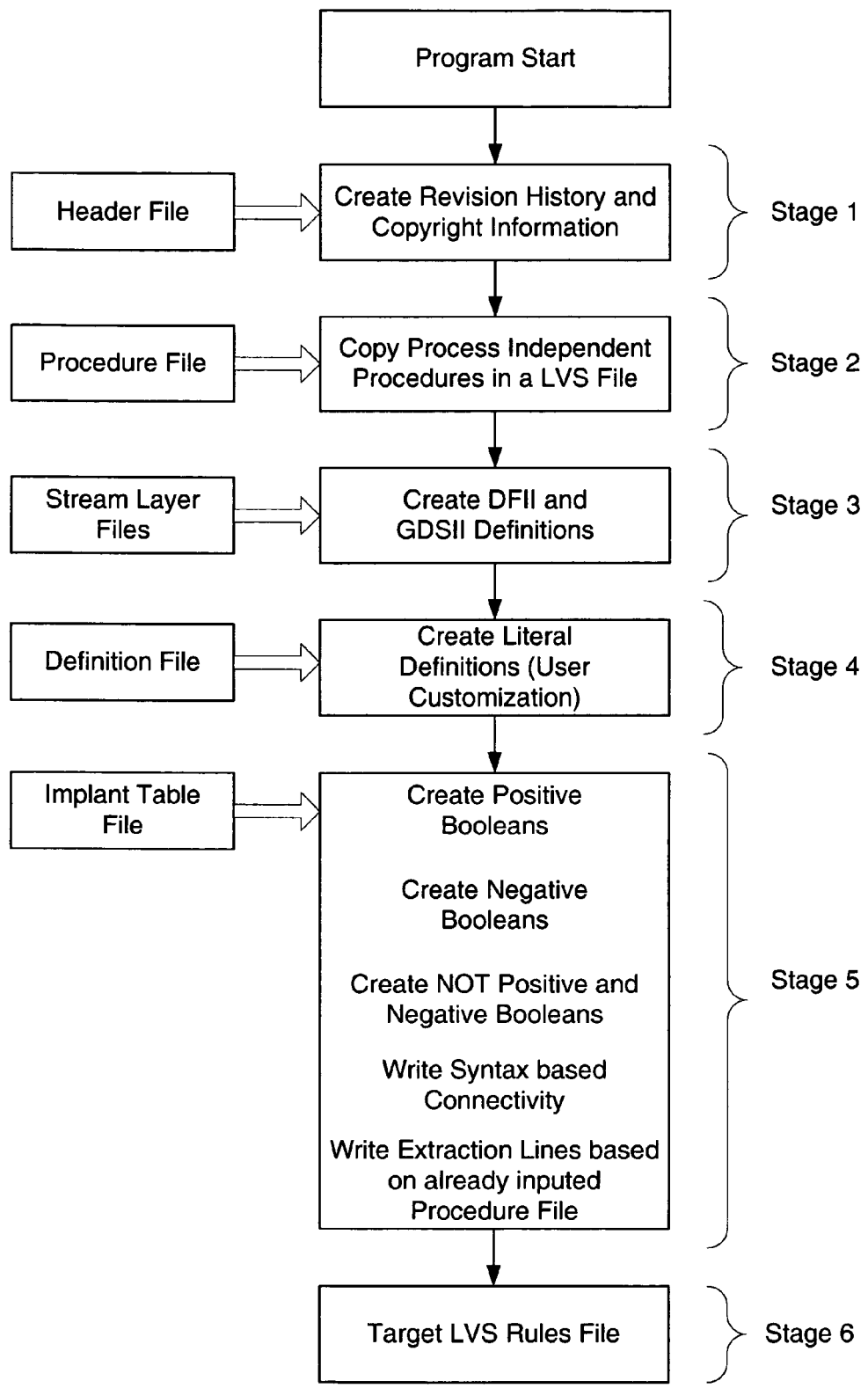
FIG. 6 is a diagram showing the functional operation of the LVSGEN program according to an embodiment of the present invention.

Turning now to FIG. 6, a diagram shows the functional operation of the LVSGEN program according to an embodiment of the present invention. The program implements various stages which process inputs from various files described above in FIG. 4 to generate the LVS rules file. In particular, information from a header file is used to create a revision history and copyright information at a stage 1. Information from a procedure file is used to copy process independent procedures for a LVS rules file at a stage 2. Stream layer files are used to create DFII and GSDII definitions for the standard circuit layout formats DFII and GSDII, which are well known in the art of integrated circuit design, at a stage 3. Definition files are used to create literal definitions which provide user customization at a stage 4. An implant table file is used to create positive and negative Boolean functions, and NOT positive and negative Boolean functions. Syntax based connectivity is also written for each of the verification tools supported by the LVSGEN program. Extraction lines based upon an already imputed procedure file are written at a stage 5. Finally, an LVS rules file is generated at a stage 6 for a given verification tool. A computer program listing appendix having code for implementing the LVSGEN program 402 according to one aspect of the present invention is attached as a part of this application on a single compact disc, the contents of which are incorporated herein by reference in their entirety. The compact disc contains a 20 KB file entitled "lvsgen.dat", which was created on Aug. 10, 2006. The code reproduced in this patent document contains material subject to copyright protection. The copyright owner of that material has no objection to the facsimile reproduction of the patent document or the patent disclosure, as it appears in the Patent and Trademark Office patent files or records, but otherwise reserves all copyright rights whatsoever.

Turning now to FIG. 7, a flow chart shows a method of verifying a layout of an integrated circuit device according to an embodiment the present invention. The method of FIG. 7 may be performed using the various processes and files of FIGS. 1-7, for example, or other processes. In particular, a physical layout for a schematic of a circuit implemented in the integrated circuit device is generated at a step 702. A design rules check of the physical layout of the integrated circuit is performed at a step 704. An implant table file having data related to the physical layout of the integrated circuit device is generated at a step 706. The implant table file is combined with process independent files and a header file associated with the integrated circuit device at a step 708. A layout-versus-schematic rules file is generated using the implant table file at a step 710. Finally, a verification of the physical layout of the integrated circuit is performed using the physical verification rules file at a step 712.

It may therefore be appreciated that the new and novel method of and circuit for verifying a layout of an integrated circuit has been described. It should be noted that the organization of the specification files are shown by way of example only, and may be merged or divided differently if desired. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of verifying a layout of an integrated circuit device, said method comprising the steps of:
    establishing designations comprising positive and negative relationships between layers and device types of said integrated circuit device, wherein said positive relationship indicates the presence of a layer with respect to a device type and said negative relationship indicates the absence of a layer with respect to a device type;
    receiving a physical layout for a schematic of a circuit to be implemented in said integrated circuit device;
    generating an implant table file associated with a process for implementing said integrated circuit device, said implant table file having one of said designations for each combination of a layer of said physical layout and said device type of said integrated circuit device to show a relationship between each layer of said physical layout and each device type of said integrated circuit device; and
    generating a layout-versus-schematic rules file using said implant table file to ensure that each said layer of said physical layout is located where it is supposed to be located; and
    performing a layout-versus-schematic verification of said physical layout using said layout-versus-schematic rules file.

2. The method of claim 1 further comprising a step of performing a design rules check of said physical layout.

3. The method of claim 1 wherein said step of generating an implant table file comprises a step of populating a comma separated value file.

4. The method of claim 3 wherein said step of populating a comma separated value file comprises a step of providing a designation of a relationship between each layer and each device type.

5. The method of claim 1 further comprising a step of creating Boolean functions for said layout-versus-schematic rules files based upon data in said implant table file.

6. The method of claim 5 further comprising a step of writing connectivity rules for a given verification tool.

7. The method of claim 1 wherein said step of generating a layout-versus-schematic rules file comprises a step of generating a plurality of layout-versus-schematic rules files associated with a corresponding plurality of layout-versus-schematic verification tools.

8. A method of verifying a layout of an integrated circuit device, said method comprising the steps of:
    establishing designations comprising positive and negative relationships between layers and device types of said integrated circuit device wherein said positive relationship indicates the presence of a layer with respect to a device type and said negative relationship indicates the absence of a layer with respect to a device type comprising a plurality of layers and a plurality of devices;
    receiving a physical layout for a schematic of a circuit to be implemented in said integrated circuit device;
    providing an implant table associated with a process for implementing said integrated circuit device, said implant table comprising an entry corresponding to each combination of a layer of said physical layout and said device type of said plurality of devices;
    providing an indication in said implant table of said positive relationship between a layer and a device type of said plurality of layers and said plurality of devices;
    providing an indication in said implant table of said negative relationship between another layer and another device type of said plurality of layers and said plurality of devices; and
    generating a layout-versus-schematic rules file using said implant table to ensure that each said layer of said physical layout is located where it is supposed to be located.

9. The method of claim 8 further comprising a step of copying process independent procedures from a procedures file to a layout-versus-schematic rules file.

10. The method of claim 8 further comprising a step of creating circuit layout format definitions from a stream layer file.

11. The method of claim 8 further comprising a step of creating literal definitions from a definition file.

12. The method of claim 8 further comprising a step of providing an indication in said implant table of a relationship between each layer of said physical layout and each device type of said plurality of devices.

13. The method of claim 12 wherein said step of providing an indication in said implant table of a relationship between each layer of said physical layout and each device type of said plurality of devices comprises a step of providing designations associated with a given process.

14. The method of claim 8 further comprising a step of performing a layout-versus-schematic verification of said physical layout of said integrated circuit using said layout-versus-schematic rules file.

15. A method of verifying a layout of an integrated circuit device, said method comprising the steps of:
- establishing designations comprising positive and negative relationships between layers and device types of said integrated circuit device wherein said positive relationship indicates the presence of a layer with respect to a device type and said negative relationship indicates the absence of a layer with respect to a device type;
- receiving a schematic of a circuit to be implemented in said integrated circuit device;
- receiving a physical layout for said schematic;
- performing a design rules check for said physical layout;
- generating an implant table file associated with a process for implementing said integrated circuit device, said implant table file having data comprising said designations showing a relationship between each layer of said physical layout and each device type of said circuit to be implemented in said integrated circuit device;
- generating a layout-versus-schematic rules file using said implant table file to ensure that each said layer of said physical layout is located where it is supposed to be located; and
- performing a layout-versus-schematic verification of said physical layout and said schematic using said layout-versus-schematic rules file.

16. The method of claim 15 further comprising a step of determining, in response to said step of performing a layout-versus-schematic verification, if said physical layout has an error.

17. The method of claim 16 further comprising a step of modifying said physical layout.

18. The method of claim 15 further comprising a step of determining, in response to said step of performing a layout-versus-schematic verification, if a process specification for said integrated circuit has an error.

19. The method of claim 18 further comprising a step of modifying said process specification if an error in said process specification is detected.

20. The method of claim 15 further comprising a step of fabricating said integrated circuit device.

\* \* \* \* \*